(12) United States Patent
Kawase et al.

(10) Patent No.: US 7,560,367 B2
(45) Date of Patent: Jul. 14, 2009

(54) METHOD FOR THERMAL PROCESSING WITH A RTP PROCESS USING TEMPERATURE SPACES IN RADIATION EQUILIBRIUM

(75) Inventors: Fumitoshi Kawase, Nanto (JP); Satoshi Shibata, Takase (JP)

(73) Assignee: Panasonic Corporation, Osaka (JP)

( * ) Notice: Subject to any disclaimer, the term of this patent is extended or adjusted under 35 U.S.C. 154(b) by 320 days.

(21) Appl. No.: 11/353,145

(22) Filed: Feb. 14, 2006

(65) Prior Publication Data

US 2006/0186354 A1 Aug. 24, 2006

(30) Foreign Application Priority Data

Feb. 18, 2005 (JP) .............................. 2005-042273

(51) Int. Cl.
*H01L 21/425* (2006.01)
(52) U.S. Cl. ..................... 438/530; 438/522; 438/795; 438/914; 250/492.2
(58) Field of Classification Search .............. 250/492.2; 438/558–560, 934, 522, 530, 540, 795–798, 438/907, 914; 257/E21.324, E21.497; 392/416, 392/418
See application file for complete search history.

(56) References Cited

U.S. PATENT DOCUMENTS

| | | | | |
|---|---|---|---|---|
| 5,418,885 A * | 5/1995 | Hauser et al. | ............. | 392/416 |
| 5,592,581 A * | 1/1997 | Okase | ............. | 392/418 |
| 6,159,873 A * | 12/2000 | Takagi | ............. | 438/795 |
| 6,165,826 A * | 12/2000 | Chau et al. | ............. | 438/231 |
| 6,268,270 B1 * | 7/2001 | Scheid et al. | ............. | 438/522 |
| 6,436,800 B1 * | 8/2002 | Kuo et al. | ............. | 438/558 |
| 6,610,967 B2 * | 8/2003 | Gat | ............. | 219/390 |
| 6,765,178 B2 * | 7/2004 | Shang et al. | ............. | 219/405 |
| 2005/0095826 A1 * | 5/2005 | Fujita et al. | ............. | 438/540 |
| 2005/0121145 A1 * | 6/2005 | Du Bois et al. | ......... | 156/345.33 |
| 2006/0110944 A1 * | 5/2006 | Kesteren | ............. | 438/795 |
| 2007/0275570 A1 * | 11/2007 | Nakamura et al. | ......... | 438/795 |
| 2009/0008346 A1 * | 1/2009 | Aihara et al. | ............. | 211/41.18 |

FOREIGN PATENT DOCUMENTS

| | | |
|---|---|---|
| JP | 2002-530847 A | 9/2002 |
| JP | 2004-140388 | 5/2004 |
| WO | WO 00/29799 | 5/2000 |

OTHER PUBLICATIONS

Japanese Notice of Reasons for Refusal, w/English translation thereof, issued in Japanese Patent Application No. JP 2005-042273 dated Mar. 11, 2009.

* cited by examiner

*Primary Examiner*—M. Wilczewski
*Assistant Examiner*—Joseph C Nicely
(74) *Attorney, Agent, or Firm*—McDermott Will & Emery LLP

(57) ABSTRACT

In this invention, a wafer is placed and kept in the low-temperature region at the bottom of a temperature space that is in a state of radiation equilibrium and that is formed inside chamber by a heating unit. The substrate temperature is gradually raised to a temperature ranging from 750° C. to 800° C. Next, the wafer is placed and kept in the high-temperature region in the temperature space and the substrate temperature is raised to the thermal processing temperature. Then thermal processing is performed for a specified period of time. By doing this, it is possible to perform uniform thermal processing without depending on the state of the wafer (ratio of an area covered by silicon nitride film or polysilicon film).

22 Claims, 6 Drawing Sheets

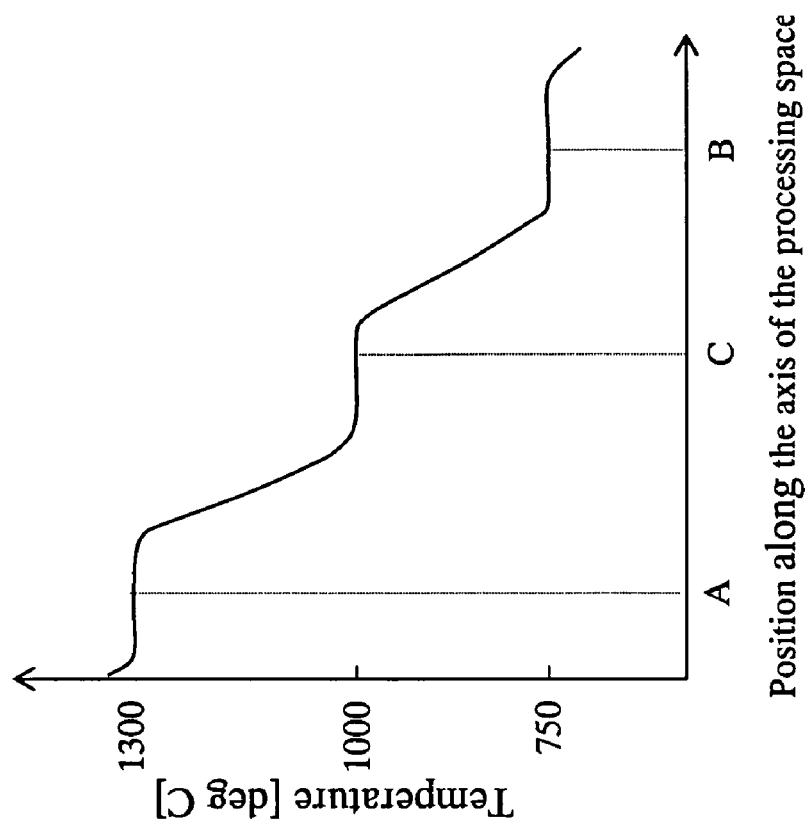
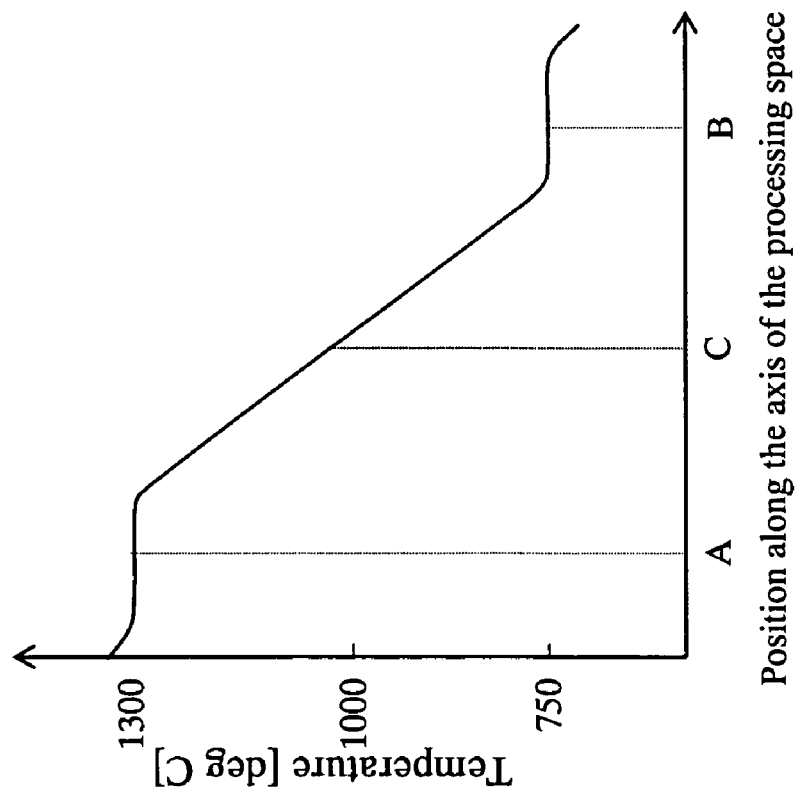

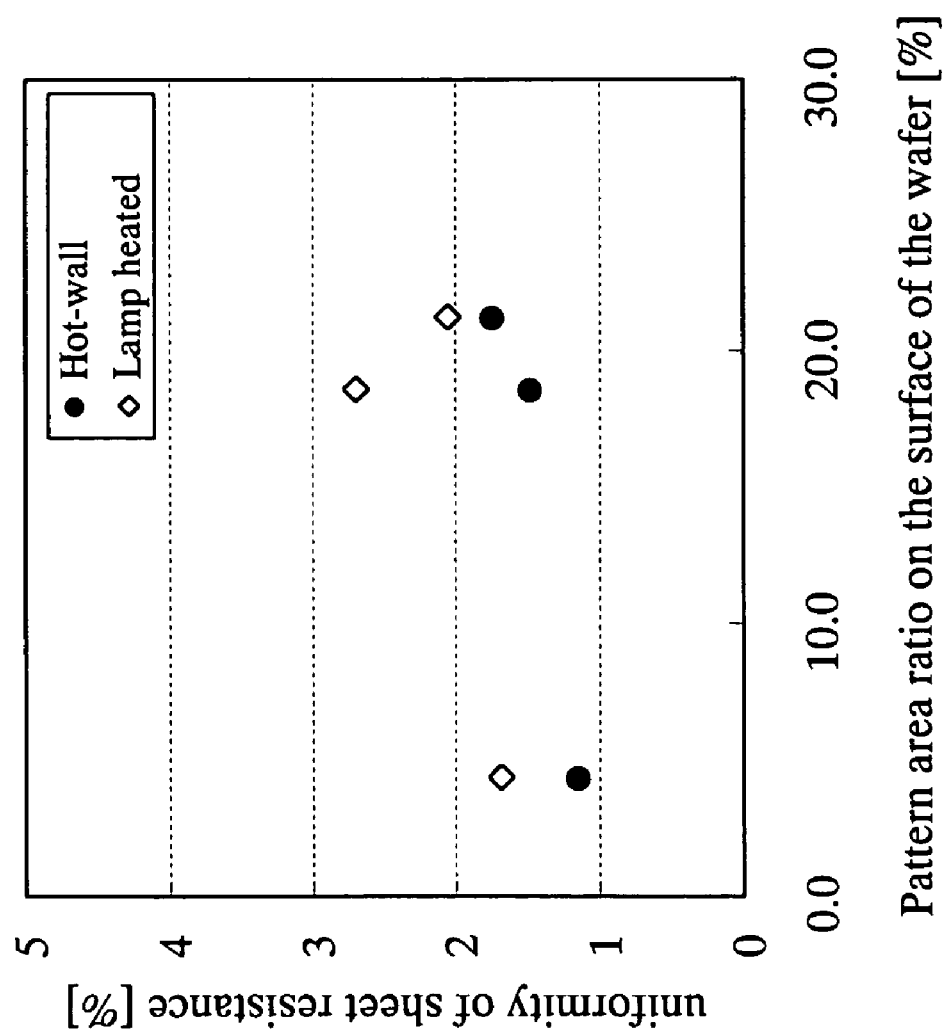

METHOD FOR THERMAL PROCESSING WITH A RTP PROCESS USING TEMPERATURE SPACES IN RADIATION EQUILIBRIUM

BACKGROUND OF THE INVENTION

1. Field of the Invention

This invention relates to an apparatus and method for thermal processing that is performed in the manufacturing process of a semiconductor device, and more particularly to an apparatus and method for thermal processing that performs thermal processing of a semiconductor wafer at high speed in a single-wafer process.

2. Description of the Related Art

In recent years, as the dimensions of the element patterns of semiconductor integrated circuit devices (hereafter referred to as semiconductor devices) have become more minute, thermal processing has shifted from long anneal processing, in which batch-type thermal processing is performed in a diffusion furnace over a long period of time, to RTP (Rapid Thermal Process) technology, in which thermal processing is performed in a short period of time of about 10 seconds in a single-wafer process. The application of this RTP technology is particularly advancing in the area of thermal activation processing that is performed after the impurity doping when forming a shallow junction on the semiconductor substrate. A lamp-type RTP apparatus, which controls the raising and lowering of the substrate temperature by adjusting the radiated energy (electromagnetic waves) that is radiated from a substrate heating lamp such as a halogen lamp, is currently being developed and is becoming wide spread as this kind of apparatus.

However, in this RTP technology, since the thermal processing time is extremely short, it is difficult to the make the substrate temperature during thermal processing uniform over the entire surface, and to match the substrate temperature with the desired thermal processing temperature. As a countermeasure against this, in a conventional lamp-type RTP apparatus, construction is employed, for example, in which both the top surface and bottom surface of the wafer are heated by a lamp, or construction is employed in which the actual wafer temperature during thermal processing is measured by a temperature sensor such as a thermocouple, and control for raising or lowering the substrate temperature is performed based on feedback of that temperature.

FIG. 5 shows the typical construction of a conventional lamp-type RTP apparatus 100. In this lamp-type RTP apparatus 100 there is a plurality of both top lamps 102 and bottom lamps 105, which are arranged at the top and bottom inside a chamber 101 in which thermal processing is performed, and they are used for heating a wafer 103. The number and arrangement of the lamps 102, 105 are optimized such that the temperature is uniformly distributed over the entire surface of the wafer 103.

Moreover, the temperature of the wafer 103 that is placed between the top lamps 102 and the bottom lamps 105 inside the chamber 101 is adjusted by controlling the electric power that is input to the top lamps 102 and the bottom lamps 105. At this time, the temperature of the wafer 103 during thermal processing is measured by a thermocouple 104 that comes in contact with the rear surface of the wafer 103, and that temperature is used in temperature-feedback control.

When the light of the heating lamp includes wavelengths between 900 to 1200 nm, and thermal processing is performed with a circuit pattern formed on the wafer 103, the transmission rate of the aforementioned wavelength of the incident light on the surface of the wafer 103 varies depending on the area and arrangement of this pattern, thus it becomes impossible to accurately measure the temperature with a thermocouple. Therefore, in current lamp-type RTP apparatuses, a pyrometer, which measures the intensity of the electromagnetic waves (infrared rays) that are radiated from the wafer without direct contact, is used as the temperature sensor instead of a thermocouple, making it possible to stably measure the substrate temperature regardless of the state of the wafer.

Also, in some lamp-type RTP apparatuses, a method is used for improving the uniformity of the temperature on the surface of the wafer 103 in which the intensity of the electromagnetic waves incident on the surface of the wafer is averaged by rotating the wafer 103 at high speed during heating.

SUMMARY OF THE INVENTION

A manufacturing of semiconductor devices, together with the rapid progress in miniaturization, is changing from production of large quantities of few product types such as memory, to production of small quantities of many product types such as system LSI. In the thermal processing in this kind of production line that produces small quantities of many types of semiconductor devices, the surface area of the circuit pattern that is formed on the wafer differs for each product type. In addition there are cases in which the materials used for that pattern, or the processing rules used (miniaturization level) differ.

Therefore, in order to deal with this kind of production of small quantities of many product types, it is necessary to optimize the thermal processing conditions for each product type. Here, the thermal processing conditions are the temperature profile that includes the thermal processing temperature, thermal processing time (period of time that a substrate is kept at the thermal processing temperature), temperature and time for the process of raising the temperature to the thermal processing temperature, and temperature and time for the cooling process.

Particularly, in activation thermal processing of an impurity diffusion layer, variations in the thermal processing temperature (temperature distribution on the wafer and variations during processing) directly affect characteristic distribution of transistors formed on the wafer, and characteristic distribution among wafers. Therefore, it is extremely important to optimize the aforementioned thermal processing conditions so that the conditions are uniform and that there is good reproducibility of the distribution of thermal processing temperature on the surface of the wafer.

However, in RTP, optimizing the thermal processing conditions for each product type requires very much work, so changing the thermal processing conditions and then performing thermal processing for each product type becomes a very large burden.

Moreover, by using optimized thermal processing conditions, the uniformity of the average temperature distribution on the wafer is maintained. However, to be more precise, it is not possible to eliminate variations in the rise of temperature that occur locally on the wafer during heating, due to the surface area of the circuit pattern formed on the wafer and the material used.

For example, as shown in FIG. 6, a typical system LSI is formed on the same silicon substrate 11 and comprises a logic section 12 containing a CMOS, and a memory section 13 containing a DRAM (Dynamic Random Access Memory) or the like.

The logic section 12 that is shown in FIG. 6 is formed by a well-known salicide (self-aligned silicide) process. In other words, a gate electrode 123 made of polysilicon film or the like and comprising a gate insulator 122 and sidewall 124 made of silicon oxide film or the like is formed in an area separated by field oxide 121 on a silicon substrate 11.

On the other hand, in the memory section 13, insulation film 131 made of BPSG (boro-phospho silicate glass) film or the like, and silicon nitride film 132 is formed on a MOS transistor (not shown in the figure) that is formed on the silicon substrate 11, and a memory-capacitor section comprises cylindrical capacitors is formed on the silicon nitride film 132.

The aforementioned memory-capacitor section has layered construction comprising in order from the bottom layer: a bottom electrode 134 made of polysilicon film, a capacitor insulation film 135 made of layered silicon nitride and silicon oxide films, $Ta_2O_5$ film, or the like, and a top electrode 136 made of polysilicon film. Also, an insulation film 137 made of silicon oxide film or the like is formed on an upper surface of the top electrode 136. The memory-capacitor section and the MOS transistor are connected by way of a polysilicon contact plug 133 that passes through the silicon nitride film 132 and the insulation film 131.

In the structure described above, the emissivity in the infrared range of the silicon nitride film 132 of the memory section 13, when radiating energy received from the outside, is greatly different than that of the silicon substrate 11. In other words, the emissivity in the infrared range of the silicon substrate 11 is 0.68, whereas the emissivity in the infrared range of the silicon nitride film 132 is 1.00. This indicates that the silicon nitride film 132 absorbs most of the energy received from the outside without reflection or penetration. Therefore, when performing RTP using a lamp, the temperature of the silicon nitride film 132 rises more quickly than that of the silicon substrate 11.

Moreover, that does not mean that the emissivity of the polysilicon film of the gate electrode 123, contact plug 133, bottom electrode 134 and top electrode 136, which change according to the film formation conditions, however, it is generally very low, 0.2 to 0.4. Therefore, in RTP using a lamp, the rise in temperature of the polysilicon film is more gradual than that of the silicon substrate 11.

On the silicon substrate 11, when lamp-type RTP is performed, the rate of the rise in temperature in the area where the logic section 12 is formed is different than that in the area where the memory section 13 is formed. Particularly, in short-term thermal processing such as RTP, the final temperature differs for each area. This phenomenon depends on the pattern formed on the wafer, so the problem is not improved by using the technology described above of rotating the wafer during heating.

Taking the aforementioned prior conditions into consideration, it is the object of the present invention to provide a thermal processing method and thermal processing apparatus capable of performing thermal processing under identical thermal processing conditions without depending on an area of a circuit pattern or arrangement of the circuit pattern formed on a wafer, or on the material of the film of the circuit pattern.

The present invention employs the following means in order to accomplish the aforementioned object. First, the invention presumes a thermal processing method for performing RTP of a plurality of semiconductor substrates having different area that are covered by a pattern made of a specified material film that is formed on each substrate.

In the thermal processing method of this invention, the semiconductor substrate is placed in a first temperature space that is in a state of radiation equilibrium at a first temperature. Then the temperature of that semiconductor substrate is raised to a first substrate temperature. Next, the semiconductor substrate, of which temperature has been raised to the first substrate temperature, is placed in a second temperature space that is in a state of radiation equilibrium at a second temperature higher than the first temperature. And the temperature of the semiconductor substrate is raised to a second substrate temperature. Then, thermal processing is performed by keeping the semiconductor substrate, of which temperature has been raised to the second substrate temperature, at the second substrate temperature for a set period of time. Here, the temperature space that is in a state of radiation equilibrium is a state in which the energy radiated into the temperature space from the outside is equal to the energy that the temperature space radiates to the outside. In other words, there is no change in temperature distribution inside that temperature space, and it is constantly kept fixed.

With this thermal processing method, a semiconductor substrate is heated in a temperature space that is in a state of radiation equilibrium, so even when the surface area covered by a pattern made of the specified material film formed on the semiconductor substrate is varied, the temperature distribution on the surface of the substrate is less than in prior lamp-type RTP. Therefore, it is possible to carry out the same thermal processing for every wafer, even though thermal processing is carried out under the same condition for these semiconductor substrates without optimizing the thermal processing conditions performed according to the surface area covered by the specified material film on the semiconductor substrate. Therefore, thermal processing becomes very simple. It is preferred that the first temperature space and the second temperature space mentioned above be formed as a series of temperature spaces.

Moreover, the method described above is particularly suitable when the period of time for keeping the substrate at the second substrate temperature is a finite time of 60 seconds or less.

The specified material film mentioned above is a silicon nitride film, polysilicon film, and so on. And this kind of structure is formed when a logic circuit and memory circuit are fabricated on same semiconductor substrate. Also, situations in which the aforementioned thermal processing method is applied are, for example, situations like activation thermal processing of an impurities diffusion layer using by ion implantation that is formed on the semiconductor substrate. This thermal processing method is not limited to the case in which the surface area covered by the specified material film differs, but can also be applied to cases in which the material of the semiconductor substrate differs.

On the other hand, in another view of the invention, it is possible to provide a thermal processing apparatus that uses the aforementioned thermal processing method. In other words, in the thermal processing apparatus of this invention, a heating unit forms a temperature space inside the processing space in which thermal processing is performed for semiconductor substrates. The temperature space has a temperature gradient with the upper side in the vertical direction being high temperature, and that is in a state of radiation equilibrium. Also, there is a substrate support base located in the processing space on which the semiconductor substrate is placed. And the substrate support base is movable along the vertical direction in the processing space. And a substrate temperature detecting unit continually detects the temperature of the semiconductor substrate placed on the substrate support base. Moreover, thermal processing is performed by moving the semiconductor substrate along the vertical direction in the temperature space based on the substrate temperature that is detected by the substrate temperature detecting unit.

In this invention, thermal processing is executed by placing a semiconductor substrate in a temperature space that is in a state of radiation equilibrium, so it is possible to perform thermal processing without changing the thermal processing conditions even for a plurality of substrates having differing amounts of surface area that are covered by a pattern made of a specified material film that is formed on the semiconductor substrate. In other words, it is possible to obtain the same thermal processing effect (same diffusion layer depth, same sheet resistance, etc.) even though the thermal processing conditions are fixed. This effect can be similarly obtained even when the materials of the semiconductor substrates differ from each other.

Therefore, it is possible to simplify production of semiconductor devices having differing amounts of substrate surface area covered by a pattern formed on the semiconductor substrate, such as in the case of small quantities and many product types of system LSI, and the like.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A and 2B are drawings showing the temperature distribution in the temperature space.

FIG. 3 is a drawing showing the uniformity of the sheet resistance value of a wafer to which the present invention is applied.

DETAILED DESCRIPTION OF THE PREFERRED EMBODIMENTS

Figure 1:
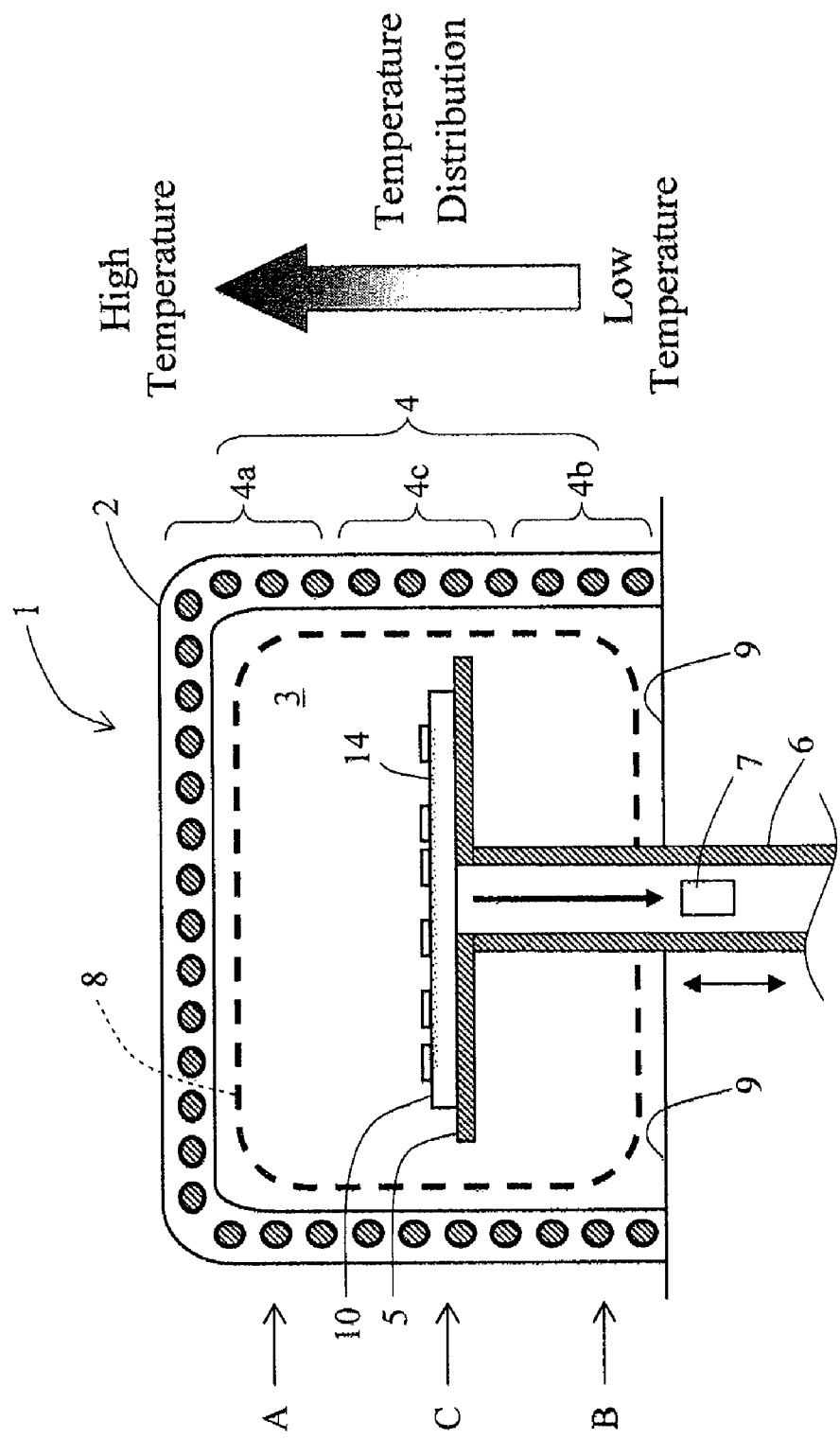
FIG. 1 is a drawing showing the construction of the thermal processing apparatus to which the present invention is applied.

The preferred embodiments of the present invention will be explained below with reference to the drawings. FIG. 1 is a drawing showing the construction of a thermal processing apparatus to which the thermal processing method of this invention is applied.

As shown in FIG. 1, a thermal processing apparatus 1 comprises a chamber 2 having a cylindrical-shaped processing space 3. That chamber 2 has an opening 9 on one end (bottom end in FIG. 1) that has an open/close mechanism for placing a wafer 10 inside the chamber 2, and by closing that opening 9, the processing space 3 is sealed. Also, a heating unit 4 is located around the chamber 2 for heating chamber 2 (the processing space 3). In the example shown in FIG. 1, that heating unit 4 is constructed by a plurality of heating wires that are located on the side wall and around (or inside) of top wall of the chamber 2.

Furthermore, the thermal processing apparatus 1 comprises a support base 5 that has a wafer-loading surface on a plane that is perpendicular to the axial direction of the processing space 3. The support base 5 is located on one end of a hollow support rod 6 that is installed such that it can move in the axial direction of the processing space 3. And the hollow section of the support rod 6 is open to the wafer-loading surface on the support base 5. The support rod 6 is constructed such that it can move while maintaining the sealed state of the opening 9.

A pyrometer 7 for measuring the temperature using the electromagnetic waves (infrared rays) that are radiated from the rear surface of the wafer that is placed on the support base 5 (surface that comes in contact with the wafer-loading surface of the support base 5) is located in the hollow section of the support rod 6. The output from the pyrometer 7 is input to a driving unit (not shown in the figure) that drives the support rod 6. Also, here, the pyrometer 7 is used as a detecting unit for detecting the substrate temperature, however, any arbitrary kind of temperature sensor can be used as long as it is capable of assuring equivalent measurement precision and accuracy.

In the construction described above, a temperature space 8 is formed inside the processing space 3 by the heating unit 4. The temperature space 8 has a uniform temperature distribution on the plane perpendicular to the axial direction inside the chamber 2. And temperature space 8 is set such that the temperature on the opening 9 side through which the support rod 6 is pushed in and out (bottom side in FIG. 1) is low, and the temperature on the opposite side is high. Also, temperature space 8 has a temperature distribution such that there is a temperature gradient that uniformly decreases from the high-temperature region toward the low-temperature region. High-temperature gas is collected at the top of the chamber 2, so as shown in FIG. 1, the axial direction of the processing space 3 should correspond to the vertical direction.

For example, in this embodiment, as shown in FIG. 2A, the upper side of the processing space 3 is set to 1300 deg C., and the lower side is set to 750 deg C. Here, in FIG. 2A, the horizontal axis corresponds to the position in the axial direction of the processing space 3, and the vertical axis corresponds to the temperature. Also, position A, position B and position C shown on the horizontal axis in FIG. 2A are the position A, position B and position C shown in FIG. 1 with arrows.

Moreover, in the temperature space 8, the temperature is controlled such that a state of radiation equilibrium between the radiant heat (electromagnetic waves in the far-infrared range) that is radiated from the inner wall of the chamber 2 heated by the heating unit 4 and the energy that is lost due to radiant heat that is radiated by the temperature space 8 (state in which energy leaving equals the energy entering the temperature space 8) is maintained. Then, in the processing space 3, the temperature distribution shown in FIG. 2A is constantly realized.

This kind of temperature control can be realized by employing construction in which a plurality of heating unit 4 comprises a upper heating unit 4a at an upper side of the chamber 2 and lower heating unit 4b at a lower side of the chamber 2. In other words, temperature-control systems are located in the upper heating unit 4a and lower heating unit 4b so that they can control the temperature of each independently, and the amount of heat generated by each of the heating unit 4a, 4b should be controlled such that the upper side of the processing space 3 is maintained at 1300 deg C., and the lower side of the processing space 3 is maintained at 750 deg C.

The arrangement of the heating unit 4 is not limited to arrangement described above, and any arbitrary arrangement could be employed as long as the arrangement generating the temperature space 8 in a state of radiation equilibrium. For example, in addition to the construction described above, it is possible that the heating unit 4 further comprises an intermediate heating unit 4c. And, as shown in FIG. 2B, such that the temperature space 8 is formed having a temperature range at a position C between position A and position B in FIG. 2A that is at 1000 deg C. Moreover, the temperature space 8 may be formed by using just the upper heating unit 4a, as long as it is possible to form a temperature space 8 that is in a state of radiation equilibrium. It is not necessary that the temperature space 8 have the temperature gradient in which the temperature uniformly decreases from the upper side toward the lower side of the processing space 3. However, the specific gravity of the gas that forms the temperature space 8 (nitrogen gas, noble gas, etc.) decreases as the temperature increases, so by forming the temperature space 8 having a temperature gradient in which the temperature uniformly decreases from the top toward the bottom of the processing space 3, the amount of energy loss decreases.

Furthermore, the heating unit 4 is not limited to heating wires, and it is possible to employ any well known heating unit such as a high-frequency heating apparatus or lamp-heated apparatus that is applied to a thermal processing apparatus such as a hot-wall annealing furnace or CVD (Chemical Vapor Deposition) apparatus.

With the above construction, by changing the position where the wafer 10 is located inside the processing space 3, it becomes possible to control the raising or lowering of the substrate temperature of the wafer 10.

Figure 6:
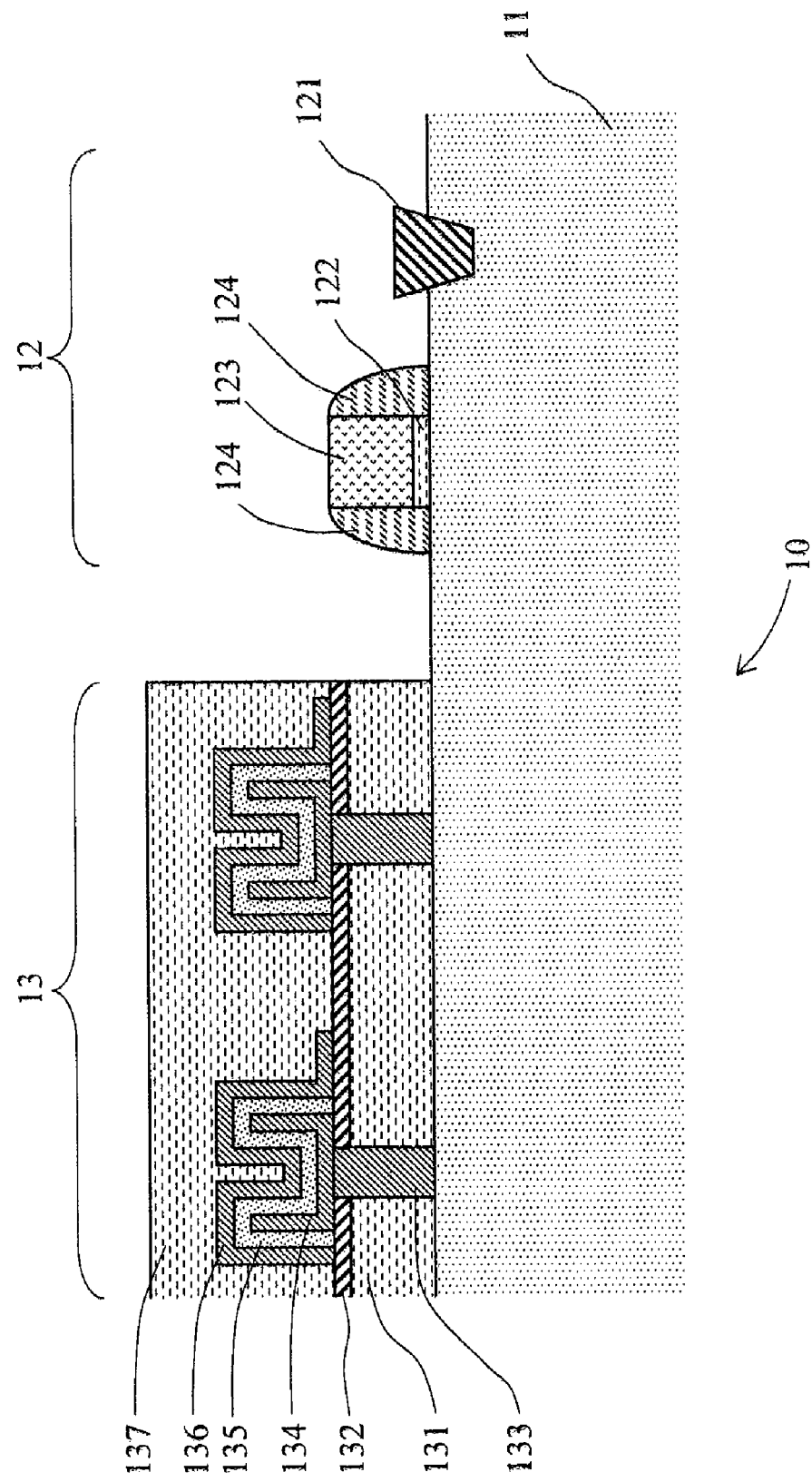
FIG. 6 is a cross-sectional drawing of a semiconductor integrated circuit device in which the logic unit and memory unit are fabricated.

Here, the thermal processing method for the wafer 10 will be explained in more detail based on the example of activation thermal processing of a system LSI as shown in FIG. 6.

First, the wafer 10 that is placed on the support base 5 is inserted into the low-temperature region (first temperature, for example, position B) at the lower side of the temperature space 8 that is formed inside the processing space 3 of the chamber 2, and heated by keeping the position for a set period of time. During this time, the position where the wafer 10 is held is at a temperature between 750 deg C. to 800 deg C., which has hardly any effect on the diffusion of impurities that are implanted into the surface of the wafer 10 by ion implantation.

Also, the amount of time that the wafer 10 is kept in this position is about 30 seconds, for example, and the temperature of the wafer 10 is gradually raised over that period of time until it reaches the temperature of the low-temperature region (first substrate temperature). At this time, the temperature of the wafer 10 during thermal processing is continually measured by a pyrometer 7. So in the case that the rise in the value measured by the pyrometer 7 is fast (the rise in temperature is fast), for example, by having the driving unit that drives the support rod 6 move the support rod 6 in the direction of removing it from the chamber 2, it is possible to lower the speed of the rise in temperature. Conversely, in the case that the rise in the value measured by the pyrometer 7 is slow (the rise in temperature is slow), by having the driving unit that drives the support rod 6 move the support rod 6 in the direction that inserts it inside the chamber 2, it is possible to increase the speed of the rise in temperature.

After the period of time for keeping the wafer 10 in the low-temperature range of the temperature space 8 has elapsed, the wafer 10 is moved to the intermediate range (position C) in the middle section of the temperature space 8 where the temperature is at the thermal processing temperature (second temperature) that is desired for performing activation thermal processing of impurities, for example, 900 deg C. to 1100 deg C. This movement is carried out over a period of time of approximately 5 to 10 seconds, for example, and during this time the temperature of the wafer 10 is raised. In this case as well, as described above, it is possible to adjust the speed of the rise in temperature by having the driving unit change the insert position of the support rod 6 based on the value measured by the pyrometer 7. Also, in the state in which the wafer 10 reaches the desired thermal processing temperature (second substrate temperature), the wafer 10 is kept at that position with the substrate temperature at the thermal processing temperature for a period of approximately 10 seconds, and activation thermal processing of the impurity diffusion layer is performed.

In this way, using the method described above, the process of raising the temperature in the low-temperature range of the temperature space 8, the process of raising the temperature until it reaches the thermal processing temperature, and the process of thermal processing at the thermal processing temperature are performed by changing the position of the support rod 6 (support base 5) inside the processing space 3 based on the value measured by the pyrometer 7.

Also, by gradually heating the wafer 10 in the low-temperature range of the temperature space 8 that is in a state of radiation equilibrium, it is possible to make the low-temperature range of the temperature space 8 and the wafer 10 be in a state of near radiation equilibrium. That is, even in the case of the wafer 10 as shown in FIG. 6 in which a memory section 13, which is formed with a silicon nitride film 132 over its entire surface, fabricated with a logic section 12, over which no silicon nitride film is formed, it is possible to raise the substrate temperature without the occurrence of localized temperature differences. Particularly, in the case where thermal processing is short-period thermal processing that is performed in a period of time greater than 0 seconds and less than 60 seconds after reaching the thermal processing temperature, by setting the wafer 10 in a state of radiation equilibrium with the temperature space 8 at a temperature that will not affect the diffusion of impurities as described above, it is possible to greatly reduce the distribution of the substrate temperature on the wafer 10.

Furthermore, in the thermal processing apparatus 1 of this invention shown in FIG. 1, heating of the wafer 10 is performed by radiant heat, or in other words, infrared rays having a long wavelength (far-infrared rays) that are radiated from the temperature space 8 that is in a state of radiation equilibrium, rather than being performed, in the case of using a conventional lamp-type RTP apparatus, by the electromagnetic wave of which wavelength is between from the visible light range to the short wavelength side of the infrared range (near-infrared range) radiated from the lamp. In that long wavelength region, the emissivity of the material film forming the semiconductor devices is nearly constant and does not depend on the material characteristics. Therefore, even in the case of the wafer 10 shown in FIG. 6 in which the memory section 13, comprising a silicon nitride film 132 over its entire surface, is fabricated with a logic section 12, it is possible to suppress the occurrence of temperature variations in the temperature distribution of the wafer 10 that is undergoing thermal processing.

FIG. 3 is a drawing showing the uniformity of the sheet resistance on a wafer for which activation thermal processing is performed by the thermal processing apparatus applying this invention. On the wafer, diffusion layer having a dose exceeding $10^{15}/cm^3$ is formed by ion implantation.

In FIG. 3, the horizontal axis corresponds to the ratio of the total surface area of the substrate that is covered by a pattern that is made of a specified material (in FIG. 6, this is the silicon nitride film 132) on the wafer 10 with respect to the surface area of the wafer 10 (hereafter referred to as the pattern area ratio). The vertical axis corresponds to the value obtained by dividing the ±3s range (s: standard deviation) of the sheet resistance of the impurity diffusion layer with the average of the sheet resistance (uniformity of sheet resistance) after thermal processing.

Also, as a comparative example, FIG. 3 shows data for the uniformity of sheet resistance of the impurity diffusion layer formed by the same ion implantation conditions and the thermal processing of the wafer is performed by a conventional lamp-type RTP apparatus. In FIG. 3, the data indicated by black dots are data from an embodiment (hot-wall method) of this invention, and the data indicated by white diamonds are data from a comparative example (lamp heated).

From FIG. 3, it can be seen that compared to the conventional lamp-type RTP apparatus, the thermal-processing apparatus of this invention has a lower uniformity of sheet resistance at each pattern area ratio, and the distribution of sheet resistance on the wafer is improved. Also, with this invention, the difference between each pattern area ratio has become less.

Figure 4:
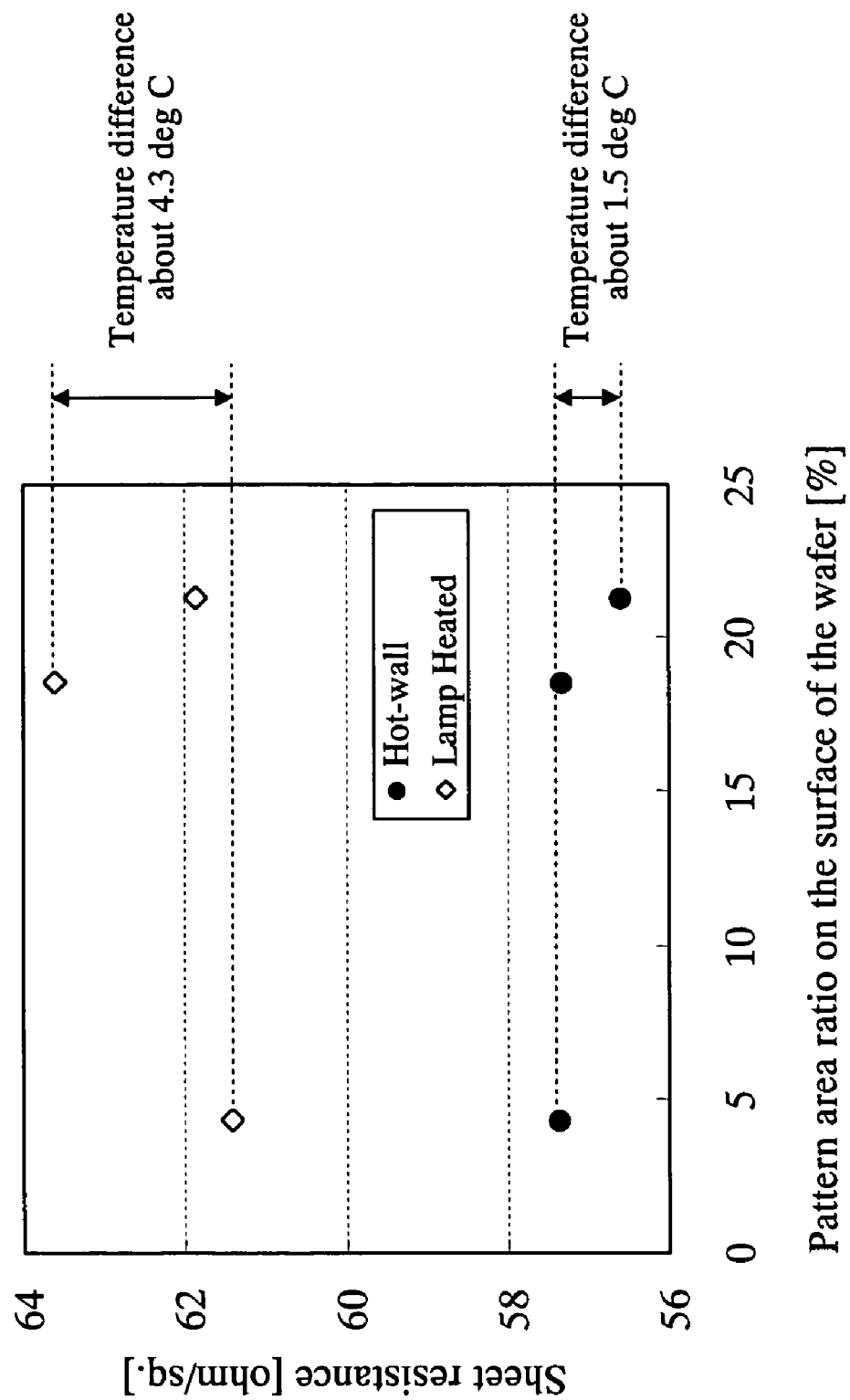
FIG. 4 is a drawing showing the sheet resistance value of a wafer to which the present invention is applied.
Figure 5:
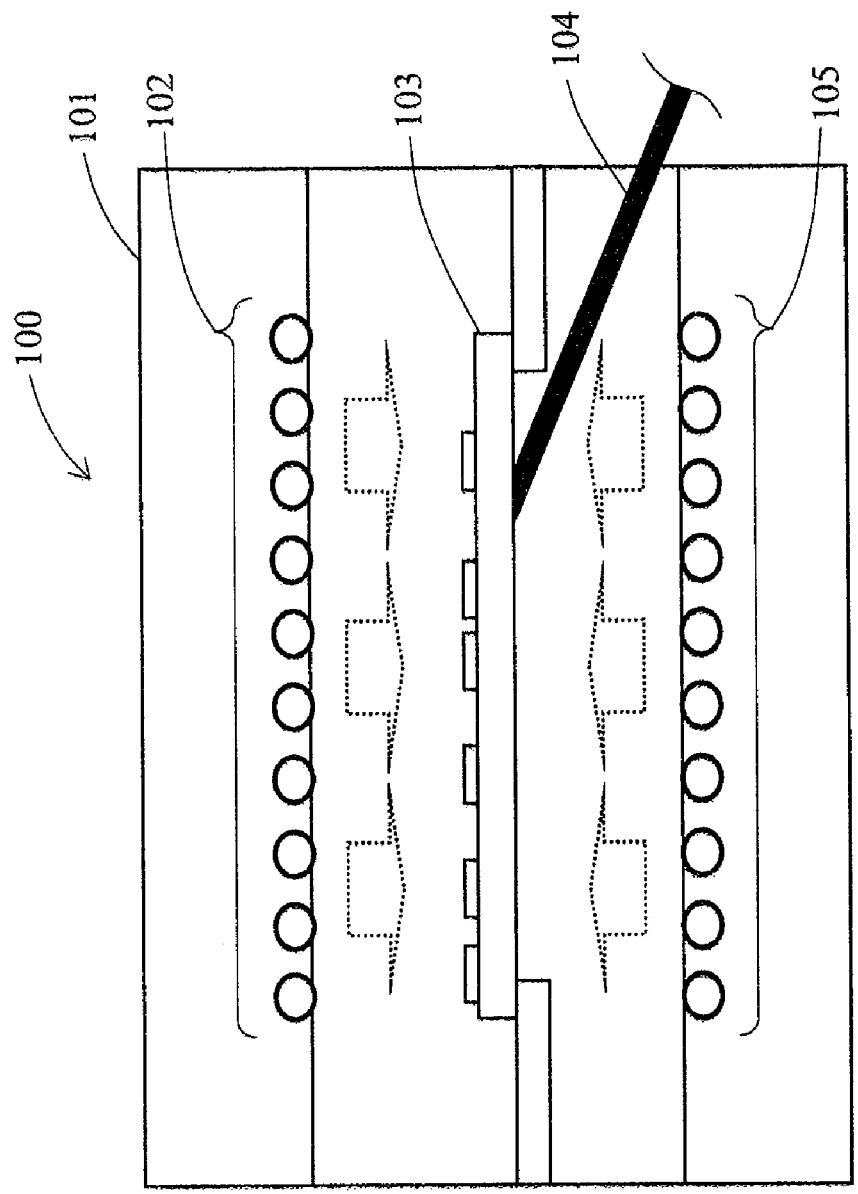
FIG. 5 is a drawing showing the construction of a conventional lamp-heated RTP apparatus.

Also, FIG. 4 is a drawing showing pattern area dependence of the sheet resistance of the impurity diffusion layer described above In FIG. 4, the horizontal axis corresponds to the pattern area ratio, and the vertical axis corresponds to the sheet resistance. In FIG. 4, the data indicated by the white diamonds is data from the conventional lamp-type RTP apparatus, and is a comparative example showing the sheet resistance of the impurity diffusion layer that is formed under identical conditions.

As shown in FIG. 4, in the thermal processing of this invention, the fluctuation in the sheet resistance due to the pattern area ratio has become small. Also, in the case of RTP, it is known that there is good correspondence between the thermal processing temperature and the sheet resistance as a result of thermal processing. And by finding the correspondence between both beforehand, it is possible to find the actual thermal processing temperature from the sheet resistance value (for example, refer to Japan Patent Publication No. 2005-39776). With this method, the temperature difference (temperature variation) that is found from the sheet resistance is a very small 1.5 deg C. with the method of this invention as compared with 4.3 deg C. in the conventional example, and is a variation that will pose no problem is actual use (for example, variation in transistor performance is small).

Therefore, with this invention, even when thermal processing is performed under identical conditions on wafers having different pattern area ratios, it is possible to obtain the same thermal processing effect, or in other words, to obtain the same activation effect for the ion implantation layer 14 (identical junction depth, identical sheet resistance). This invention is not limited to activation thermal processing of the impurity diffusion layer, and for example, it can also be applied to thermal processing of performing oxidation or nitriding for forming thin oxidation film or nitride film. In that case, it is possible to obtain uniform film properties on the entire surface of the wafer.

Also, uniformity of the thermal processing temperature in RTP of this invention is not only obtainable in the just the case of the silicon nitride film 132 in FIG. 6 as the target, but similar uniform thermal processing temperature can be obtained for a layered film having a plurality of films of different materials.

Above, an example of the case in which the material of the wafer is silicon was explained, however, the present invention is not limited to a silicon substrate, and can also be applied to different kinds of substrates such as a semiconductor substrate consisting of various chemical compounds such as a GaAs substrate, SOI (Silicon On Insulator) substrate, or the like.

In other words, with this invention, it is possible to fix the thermal processing condition to one condition and to perform uniform thermal processing on one chip, on the surface of one wafer, and among a plurality of wafers.

This invention is capable of performing thermal processing under identical thermal processing conditions even when there is a plurality of films having different emissivity on the wafer, or when the surface area of the wafers differs from each other, so it is very useful in thermal processing in the manufacturing process of a semiconductor device.

Further, it is possible to apply various design changes in the range of the subject matter described in the scope of claim for patent.

While the invention has been shown and described in detail, the foregoing description is in all aspects illustrative and not restrictive. It is therefore understood that numerous modifications and variations can be devised without departing from the scope of the invention.

The invention claimed is:

1. A thermal processing method for performing rapid thermal processing of a plurality of semiconductor substrates having different areas that are covered by a pattern made of a specified material film formed on each substrate, comprising steps of:

a first temperature raising step for raising a temperature of a semiconductor substrate to a first substrate temperature by placing the semiconductor substrate in a first temperature space that is in a state of radiation equilibrium at a first temperature;

a second temperature raising step for raising the temperature of the semiconductor substrate to a second substrate temperature by placing the semiconductor substrate, of which temperature has been raised to the first substrate temperature, in a second temperature space that is in a state of radiation equilibrium at a second temperature higher than the first temperature; and, a step for performing rapid thermal processing by keeping the semiconductor substrate, of which temperature is raised to the second substrate temperature, at the second substrate temperature for a set period of time, wherein each semiconductor substrate has an ion implantation layer, the rapid thermal processing being activation processing of the ion implantation layer of each semiconductor substrate, a pattern made of a specified material film having a different emissivity of electromagnetic waves in an infrared range as compared to the emissivity of the semiconductor substrate is formed on each semiconductor substrate, and at least one of the plurality of semiconductor substrates has a different pattern area made of the specified material film, and the first temperature, the second temperature and the time for keeping the semiconductor substrate at the second substrate temperature are fixed in each rapid thermal processing of the plurality of semiconductor substrates to obtain the same activation effect for the ion implantation layer of each of the plurality of semiconductor substrates, the plurality of semiconductor substrates containing the at least one of the plurality of semiconductor substrates having the different pattern area made of the specified material film.

2. The thermal processing method according to claim 1 wherein the first temperature space and the second temperature space are formed as a series of temperature spaces.

3. The thermal processing method according to claim 2 wherein the time for keeping the substrate at the second substrate temperature is a finite time of 60 seconds or less.

4. The thermal processing method according to claim 2 wherein the specified material film is a silicon nitride film or polysilicon film.

5. The thermal processing method according to claim 2 wherein a logic circuit and memory circuit are formed on the semiconductor substrate, and the pattern made of the specified material film is a pattern for a memory circuit.

6. The thermal processing method according to claim 1 wherein the time for keeping the substrate at the second substrate temperature is a finite time of 60 seconds or less.

7. The thermal processing method according to claim 1 wherein the specified material film is a silicon nitride film or polysilicon film.

8. The thermal processing method according to claim 1 wherein a logic circuit and memory circuit are formed on the semiconductor substrate, and the pattern made of the specified material film is a pattern for a memory circuit.

9. The thermal processing method according to claim 1, wherein the same activation effect for the ion implantation layer of each semiconductor substrate further comprises each ion implantation layer having a depth that is the same.

10. The thermal processing method according to claim 1, wherein the same activation effect for the ion implantation layer of each semiconductor substrate further comprises each ion implantation layer having a sheet resistance that is the same.

11. A thermal processing method for performing rapid thermal processing of a plurality of semiconductor substrates having different areas that are covered by a pattern made of a specified material film formed on each substrate, comprising steps of:

a first temperature raising step for raising a temperature of a semiconductor substrate to a first substrate temperature by placing the semiconductor substrate in a first temperature space that is in a state of radiation equilibrium at a first temperature;

a second temperature raising step for raising the temperature of the semiconductor substrate to a second substrate temperature by placing the semiconductor substrate, of which temperature has been raised to the first substrate temperature, in a second temperature space that is in a state of radiation equilibrium at a second temperature higher than the first temperature; and, a step for performing rapid thermal processing by keeping the semiconductor substrate, of which temperature is raised to the second substrate temperature, at the second substrate temperature for a set period of time, wherein each semiconductor substrate has an ion implantation layer, the rapid thermal processing being activation processing of the ion implantation layer of each semiconductor substrate, a pattern made of a specified material film having a different emissivity of electromagnetic waves in an infrared range as compared to the emissivity of the semiconductor substrate is formed on each semiconductor substrate, and at least one of the plurality of semiconductor substrates has a different pattern area made of the specified material film, and the first temperature, the second temperature and the time for keeping the semiconductor substrate at the second substrate temperature are fixed in each rapid thermal processing of the plurality of semiconductor substrates to obtain the same activation effect for the ion implantation layer of each semiconductor substrate, wherein the rapid thermal processing for each substrate is performed by a single-wafer process.

12. The thermal processing method according to claim 11 wherein the first temperature space and the second temperature space are formed as a series of temperature spaces.

13. The thermal processing method according to claim 12 wherein the time for keeping the substrate at the second substrate temperature is a finite time of 60 seconds or less.

14. The thermal processing method according to claim 12 wherein the specified material film is a silicon nitride film or polysilicon film.

15. The thermal processing method according to claim 12 wherein a logic circuit and memory circuit are formed on the semiconductor substrate, and the pattern made of the specified material film is a pattern for a memory circuit.

16. The thermal processing method according to claim 11 wherein the time for keeping the substrate at the second substrate temperature is a finite time of 60 seconds or less.

17. The thermal processing method according to claim 11 wherein the specified material film is a silicon nitride film or polysilicon film.

18. The thermal processing method according to claim 11 wherein a logic circuit and memory circuit are formed on the semiconductor substrate, and the pattern made of the specified material film is a pattern for a memory circuit.

19. The thermal processing method according to claim 11, wherein the same activation effect for the ion implantation layer of each semiconductor substrate further comprises each ion implantation layer having a depth that is the same.

20. The thermal processing method according to claim 11, wherein the same activation effect for the ion implantation layer of each semiconductor substrate further comprises each ion implantation layer having a sheet resistance that is the same.

21. A thermal processing method for performing rapid thermal processing of a plurality of semiconductor substrates, comprising steps of:

a first temperature raising step for raising a temperature of a semiconductor substrate to a first substrate temperature by placing the semiconductor substrate in a first temperature space that is in a state of radiation equilibrium at a first temperature;

a second temperature raising step for raising the temperature of the semiconductor substrate to a second substrate temperature by placing the semiconductor substrate, of which temperature has been raised to the first substrate temperature, in a second temperature space that is in a state of radiation equilibrium at a second temperature higher than the first temperature; and a step for performing rapid thermal processing by keeping the semiconductor substrate, of which temperature has been raised to the second substrate temperature, at the second substrate temperature for a set period of time, wherein each semiconductor substrate has an ion implantation layer, the rapid thermal processing being activation processing of the ion implantation layer of each semiconductor substrate, and at least one of the plurality of semiconductor substrates is made from different materials having different emissivity of electromagnetic waves in an infrared range as compared to the emissivity of another semiconductor substrate, and the first temperature, the second temperature and the time for keeping the semiconductor substrate at the second substrate temperature are fixed in each rapid thermal processing of the plurality of semiconductor substrates to obtain the same activation effect for the ion implantation layer of each of the plurality of semiconductor substrates, the plurality of semiconductor substrates containing the at least one of the plurality of semiconductor substrates being made from the different materials having the different emissivity as compared to the emissivity of the another semiconductor substrates.

22. The thermal processing method according to claim 21 wherein the rapid thermal processing for each substrate is performed by a single-wafer process.

* * * * *